United States Patent [19]

Dingwall

[11] 4,354,151
[45] Oct. 12, 1982

[54] VOLTAGE DIVIDER CIRCUITS
[75] Inventor: Andrew G. F. Dingwall, Bridgewater, N.J.
[73] Assignee: RCA Corporation, New York, N.Y.
[21] Appl. No.: 158,942
[22] Filed: Jun. 12, 1980
[51] Int. Cl.³ .............................................. G05F 1/613
[52] U.S. Cl. .................................... 323/225; 307/264; 323/271; 323/282
[58] Field of Search .................... 307/264, 296 R, 451, 307/452; 323/223, 225, 226, 268–272, 282, 314–317; 330/264

[56] References Cited
U.S. PATENT DOCUMENTS

| | | | |
|---|---|---|---|
| 3,566,145 | 2/1971 | Goodale | 330/264 |
| 3,872,390 | 3/1975 | Nash | 330/264 |
| 4,021,751 | 5/1977 | Suzuki | 330/264 |
| 4,029,971 | 6/1977 | Pryor | 307/209 |
| 4,135,125 | 1/1979 | Oura | 323/313 |
| 4,159,450 | 6/1979 | Hoover | 330/264 |
| 4,191,898 | 3/1980 | Ulmer | 307/264 |

*Primary Examiner*—A. D. Pellinen
*Attorney, Agent, or Firm*—Samuel Cohen; Henry I. Schanzer

[57] ABSTRACT

Complementary symmetry inverter connected at its output terminal to the input terminal of a complementary symmetry source follower and a feedback connection, via negligible impedance means, from the output terminal of the source follower to the input terminal of the inverter. The circuit produces at the output terminal of the source follower a voltage which is a fraction of the value of the operating voltage applied to the inverter. In one embodiment a selectively enabled switch is connected between the input and output terminals of the source follower for turning off the source follower when the switch is enabled.

14 Claims, 3 Drawing Figures

VOLTAGE DIVIDER CIRCUITS

This invention relates to circuits for generating a voltage which is a portion of the operating voltage externally applied to the circuits. In particular, this invention relates to low power voltage dividing circuits providing some regulation for load variations.

In many applications it is desirable to operate certain internal portions of a circuit at reduced voltages (i.e. voltages which are less than the externally applied power supply voltages). This decreases the extent to which those portions of the circuit are stressed. As a result, there is an improvement in the reliability and yield of the circuit and a decrease in its power dissipation.

In some applications it is necessary to generate voltages which are predetermined fractions of the value of the power supply voltage. For example, it has been found that, in memory arrays where the cells of the array are operated at some voltage (e.g. $V_{DD}$), if the bit lines are precharged to a potential (e.g. $V_{DD}/2$), information can be read out of selected cells without disturbing the contents of unselected cells. This is discussed in detail in a co-pending application filed Aug. 7, 1978, on behalf of myself and Roger G. Stewart, bearing Ser. No. 931,748, titled PRECHARGE CIRCUIT FOR MEMORY ARRAY now U.S. Pat. No. 4,208,730, issued June 17, 1980, assigned to the same assignee as this application, and the subject matter of which is incorporated herein by reference.

Known circuit techniques for producing reduced voltages include, for example, the use of resistive dividers and/or series strings of diodes and/or transistors. However, these known techniques have one or more of the following drawbacks:

1. They dissipate a substantial amount of power which is particularly troublesome in complementary symmetry circuits whose main advantage of low power dissipation is thereby negated; and 2. Passive voltage division techniques have very poor regulation under load.

Circuits embodying the invention include a complementary inverter stage whose output is connected to the input of a complementary voltage follower stage whose output, in turn, is fed back to the input of the complementary inverter. The voltage follower includes two transistors of complementary conductivity type operated in the voltage follower mode and connected so that only one of the two source follower transistors is on at any time. Thus, the voltage follower stage dissipates no static or steady state power (except for leakage). The inverter stage draws power. But, this stage can be made with very small, high impedance, devices so that the power drawn is relatively small.

Circuits embodying the invention may also include switch means connected between the input and the output of a voltage follower stage. The switch means, when turned-on, provides a low impedance connection between the input and the output of the follower stage turning-off the transistors of the follower stage.

In the accompanying drawing like reference characters denote like components, and:

Figure 1:
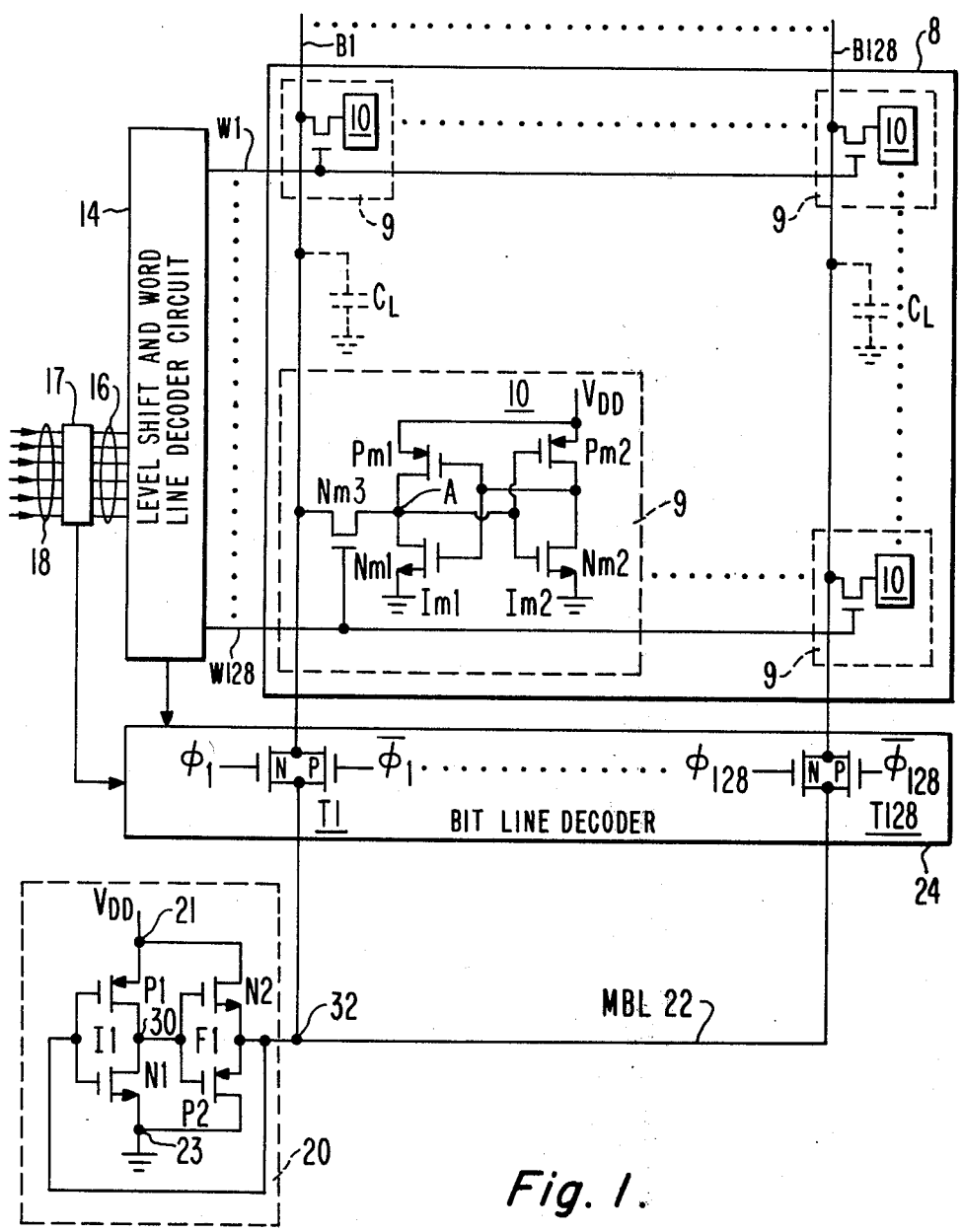
FIG. 1 is a semi-block, semi-schematic diagram of a memory system including a voltage dividing circuit embodying the invention.

Insulated-gate field-effect transistors (IGFETs) are the active devices preferred for use in practicing the invention. For this reason, the circuit is illustrated in the drawing as employing such transistors and will be so described hereinafter. However, this is not intended to preclude the use of other suitable devices and to this end, the term "transistor," when used without limitation in the appended claims, is used in a generic sense.

In the figures, enhancement type IGFETs of P conductivity type are identified by the letter P followed by a particular reference numeral; and enhancement type IGFETs of N-conductivity type are identified by the letter N followed by a particular reference numeral. The characteristics of IGFETs are well known and need not be described in detail. But, for a clearer understanding of the description to follow, definitions and characteristics of IGFETs pertinent to the invention are set forth in column 2 of U.S. Pat. Nos. 4,037,114 and 4,001,606, and are incorporated herein by reference.

The circuit of FIG. 1 includes a bias (or intermediate level) circuit 20, connecting to a master bit line (MBL) 22 for charging it to a predetermined voltage.

The circuit 20 includes complementary symmetry inverter I1 comprised of enhancement insulated-gate field-effect transistors (IGFETS) P1 and N1. The source of P1 is connected to a terminal 21 to which is applied an operating potential of $V_{DD}$ volts. The source of N1 is connected to a terminal 23 to which is applied ground potential. The drains of P1 and N1 are connected to the inverter output terminal 30. The circuit 20 also includes a complementary symmetry source follower stage F1 comprised of IGFETs N2 and P2. The drain of N2 is connected to terminal 21, the drain of P2 is connected to terminal 23. The gates of P2 and N2 are connected to the drains of P1 and N1 at terminal 30, and the sources of P2 and N2 are connected to output terminal 32. The output of the source follower stage is fed back via a short circuit, that is a negligible impedance connection, to the gates of P1 and N1. The source follower mode is also referred to herein, generically, as voltage follower mode since the voltage at the source (of a source follower) follows the voltage at the gate plus or minus some voltage offset due to the $V_T$ of the source follower transistor(s).

The operation of the circuit 20 will first be discussed neglecting the effect of the threshold voltages ($V_T$) of the source follower transistors N2 and P2. The output at 30 of inverter I1 is applied to the gates of N2 and P2. The direct current (d.c.) input impedance of IGFETs P2 and N2 is extremely high ($10^{15}$ ohms) and is further increased by the source follower action. The extremely high input impedance of N2 and P2 permits P1 and N1 to be made very small since the loading on P1 and N1 is very small. The voltage ($V_{32}$) produced at the sources of N2 and P2 follows the voltage ($V_{30}$) applied to their gates. Hence, $V_{32}$ at terminal 32 is in phase with and (neglecting the $V_T$ of N2 and/or P2) is approximately equal to the inverter output voltage ($V_{30}$).

The output ($V_{32}$) of the source follower stage is fed back to the gate electrodes of IGFETs P1 and N1. Since $V_{32}$ is assumed approximately equal to $V_{30}$, the output of inverter I1 is thus fed back to its input. Inverter I1 is then effectively "self-biased" in the linear portion of its transfer characteristic and functions as a linear amplifier. For the "self-bias" condition, the inverter-amplifier is biased in the linear region at the point at which its output voltage ($V_O$) is equal to its input voltage ($V_{IN}$). The bias point, switching point, or quiescent point ($V_Q$) of a complementary inverter for "self-bias" arrangement occurs at the intersection of its transfer curve and the line satisfying the equation $V_{IN}=V_{OUT}$ as shown in FIG. 2.

The shape of the transfer curve of a complementary inverter is dependent (among others) on the characteristics of the N and P transistors forming the inverter. The $V_Q$ of a self-biased (with no external input signal applied) complementary inverter is a function of the impedances of its P and N transistors. The impedance (Z) of each transistor is in turn a function of the ratio of its channel length (L) to its channel width (W), [$Z=(L/W)$].

Figure 2:
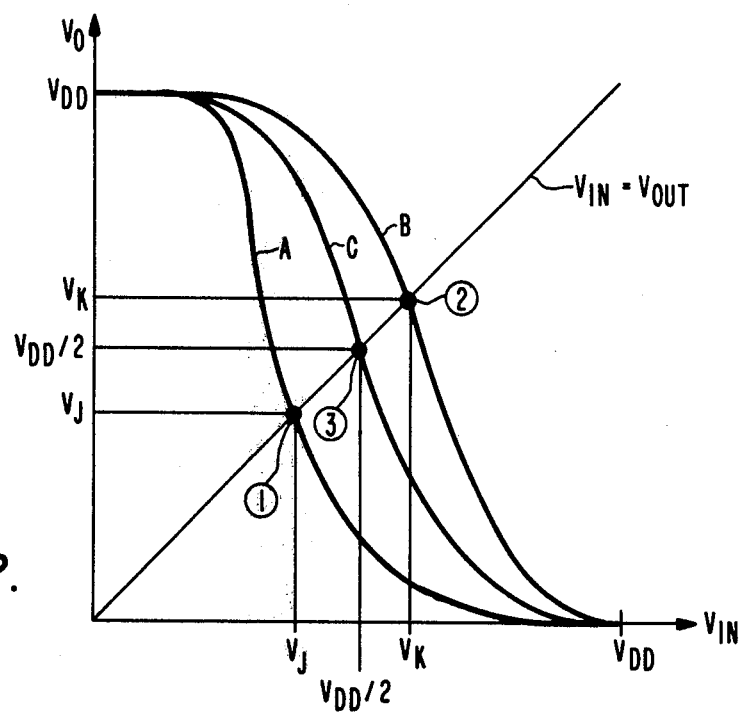
FIG. 2 is a drawing of the transfer characteristic of an inverter used in practicing the invention.

The quiescent point ($V_Q$) of an inverter may be set at a desired level (e.g. $V_{DD}/2$) by proper selection and design of the width to length (W/L) ratios of the IGFETs forming the inverters. [This assumes that the other IGFET parameters, (e.g. the threshold voltages, oxide thickness, doping levels), are the same.] Curve C, FIG. 2, represents the transfer characteristic of an inverter whose P and N IGFETs have equal impedances for the same value of gate to source voltage ($V_{GS}$) applied in a direction to turn on the transistors. In curve C, $V_Q=V_O=V_{IN}=V_{DD}/2$.

In the discussion of the operation of circuit 20 to follow, it will be assumed that the impedance ($Z_{P1}$) of transistor P1 is equal to the impedance ($Z_{N1}$) of transistor N1 for equal values of gate to source potentials ($V_{GS}$) applied in a direction to turn on P1 or N1. It will further be assumed that transistors P1 and N1 are very small geometry devices relative to P2 and N2. That is, the ON impedance of their conduction path is assumed to be relatively large in comparison to the ON impedance of the conduction paths of transistors N2 and/or P2. Transistors N2 and P2 are relatively large devices capable of conducting large currents.

The transfer characteristic of inverter I1 is shown by curve C in FIG. 2. For low values of input voltage (the voltage applied to the gate of P1 and N1) the output voltage (the voltage at the drains of P1 and N1) is essentially equal to the supply voltage ($V_{DD}$). As the input voltage is increased towards $V_{DD}/2$, a point is reached where the output voltage begins to fall. As the input voltage is further increased the output voltage drops to $V_{DD}/2$, shown as midpoint 3 of curve C, which point is defined as the switching point. As the input voltage is increased still further (above $V_{DD}/2$) the output voltage falls to essentially zero volts and remains at zero volts as the input voltage is increased still further. The switch point of inverter I1 may be shifted about $V_{DD}/2$ by making the geometries of the upper (P1) and lower (N1) devices unequal. The transfer characteristics can be shifted to the left (See Curve A) by making the W/L ratio of the N transistor greater than the W/L ratio of the P transistor, and can be shifted to the right (See Curve B) by making the W/L of the N transistor smaller than the W/L of the P transistor.

The effect of the $V_T$ of N2 and P2 is best explained by noting that the voltage $V_{32}$ at output terminal 32 is equal to $V_{30}$ plus or minus a small voltage offset ($\Delta V$) due to the $V_T$ of either N2 or P2. The offset results in a deadband equal to the offset at the output. However, the magnitude of the voltage offset due to the $V_T$ of N2 and P2 is generally not significant. The voltage offset due to $V_T$ and the concurrent dead-band at the output when the output 32 is fed back to the input of I1 (i.e. closed loop operation) approaches the value of $V_T$ divided by the open loop voltage gain of the amplifier configuration. In circuit 20 the open loop gain is equal to the voltage gain of inverter I1 multiplied by the voltage gain of the source follower stage F1.

Since I1 is biased at or near the center of its transfer characteristic, it is being operated in a very high gain region. For ease of description, assume the voltage gain of the inverter to be 50. The voltage gain of the source follower may be assumed to be equal to 1. Assuming the $V_T$ of each one of N2 and P2 to be equal to 1 volt, the offset or dead-band at the output of the source follower stage is equal to 1 volt divided by 50 or 0.02 volts.

In many integrated circuit applications when, for example, $V_{DD}$ is 5 volts and $V_{DD}/2$ is 2.5 volts a dead band of $\pm 0.02$ about the 2.5 volt level has no significant effect on the operation of the circuit.

The operation of circuit 20 is now discussed assuming the quiescent point of the inverter to be $V_{DD}/2$. If $V_{30}$ is at $V_{DD}/2$ and if the output ($V_{32}$) of the source follower is also at $V_{DD}/2\pm\Delta V$ (where $\Delta V$ is approximately 0.02 volt) then transistors N2 and P2 are turned off since the gate-to-source potentials ($V_{GS}$) of N2 and P2 is equal to, or close to zero. Thus, in the quiescent state, if the output 32 is charged to $V_{DD}/2$, transistors N2 and P2 are turned off. Hence, there is no current flowing through N2 or P2 except for leakage currents which are negligible, and there is little, if any, power dissipation.

When the potential on line 22 (connected to output 32) goes below $V_{DD}/2$, transistor P1 becomes more conductive than transistor N1. This causes $V_{30}$ to rise above $V_{DD}/2$ causing transistor N2 to turn on and supply (source) more current into terminal 32 until the voltage at terminal 32 is brought back to $V_{DD}/2$ volts. As $V_{30}$ initially rises, transistor P2 is driven further into its non-conducting condition since the potential applied to its gate becomes more positive relative to the potential applied to its source ($V_{32}$). When $V_{32}$ reaches $V_{DD}/2\pm\Delta V$, both transistors N2 and P2 are again cut off.

When the potential on line 22 goes above $V_{DD}/2$, transistor N1 becomes more conductive than transistor P1. This causes $V_{30}$ to drop below $V_{DD}/2$ causing transistor P2 to turn on and sink current out of terminal 32 in a direction to reduce the output voltage. As $V_{30}$ initially drops; N2 is driven further into its non-conducting state since the potential at its gate becomes less positive relative to the potential at its source ($V_{32}$). When the balanced condition $V_{32}=(V_{DD}/2\pm\Delta V)$ is restored, both N2 and P2 are again cut off.

Thus, in the operation of circuit 20 only one of the two source follower transistors (N2, P2) is turned on at any one time. This ensures that the static or steady state dissipation of the circuit is very low.

The output impedance of the source follower circuit is relatively low and the output voltage wll be maintained over a wide range of load variations.

In circuit 20, only inverter I1 dissipates power in the quiescent state. Since the output of inverter I1 drives the gates (input) of transistors N2 and P2, and since the input impedance of P2 and N2 is extremely high ($10^{15}$ or more ohms) transistors P1 and N1 may be very high impedance low current carrying devices. Therefore, the power dissipation of the inverter stage is made very low by appropriate selection of the sizes of transistors P1 and N1.

For ease of discussion, it was assumed above, that the inverter I1 was biased at its mid-point (e.g. $V_{DD}/2$). However, it should be evident that the ratio of P1 to N1 can be varied over a relatively wide range to permit the quiescent operating point of the inverter to be anywhere between, for example, 30% and 70% of $V_{DD}$. It is, therefore, recognized that the ratio of the geometries of P1 and N1 can be used to determine the voltage divider ratio, where the voltage being divided is $V_{DD}$. It is further recognized that the output of an inverter can be buffered via a source follower stage and then fed back to the inverter to provide a relatively constant voltage source exhibiting voltage regulation over a wide range of load variation.

The circuit of FIG. 1 includes a memory array 8 of cells 9 arranged in rows (words) and columns (bits). Each memory cell, as shown in the lower left hand corner of array B includes a gating transistor Nm3 whose conduction path is connected between a bit line (BL) and the Input-Output (I/O) point (A) of a flip flop 10 comprised of two cross coupled complementary inverters Im1 and Im2. Each one of inverters Im1 and Im2 includes two IGFETs of complementary conductivity type having their source drain paths connected in series between $V_{DD}$ and ground. The drains of IGFETs Pm1 and Nm1 forming inverter Im1, are connected in common with the gates of IGFET Pm2 and Nm2 to I/O point A also defined as the "exterior" node of the cell. The drains of Pm2 and Nm2, forming inverter I2, are connected to the gates of Pm1 and Nm1 at node A also defined as the "interior" node of the cell. A word line is connected to the control (gate) electrode of Nm3. The potential ($V_{WL}$) on the word line controls the conductivity of N3.

As to the memory cell circuit assume: (a) that the flip-flop transistors Pm1, Nm1, Pm2, and Nm2 have the same source-to-drain impedance for the same value of gate-to-source potential; (b) that the transition point of inverters I1 and I2 is $V_{DD}/2$. That is, for values of gate voltage more negative than $V_{DD}/2$ the inverter output is high (more positive than $V_{DD}/2$) and for values of gate voltage more positive than $V_{DD}/2$ the inverter output is low (less positive than $V_{DD}/2$); (c) that the "flip-point" ($V_{FP}$) of the flip-flop is $V_{DD}/2$, where the "flip-point" is defined as the voltage at node A for which the memory cell neither sinks (draws) current from, nor sources (supplies) current into, node A; and (d) that $V_{DD}/2$ volts, is applied to the bit line.

For the bit line precharged to $V_{DD}/2$, the memory cell will not be disturbed even if the impedance $Z_{N3}$ of Nm3 is much less than the impedance of transistors Pm1 and Nm1. The impedance of Nm3 is no longer critical and can be varied over a wide range without causing a false write problem. In fact, there is a "safe-margin" which is defined herein as a range of voltage that may be applied to the bit line above or below $V_{FP}$ without causing the cell to change state when the latter is coupled via Nm3 to the bit line.

For an assumed $V_{FP}$ of $V_{DD}/2$ the bit line voltage ($V_{BL}$) can be set anywhere within the "safe" range without disturbing the memory cell even though $V_{DD}/2$ is the preferred level.

Maintaining the bit line at or near the flip point eliminates the problem of "false-write" or "disturb" of the unselected cells during the write or read mode. Furthermore, $Z_{N3}$ can be made a very small impedance without a disturb problem. Hence, Nm3 can be overdriven into conduction and information can be written safely and quickly into selected memory cells. Still further, the problem of disturbing the contents of the memory cell, during read, if $Z_{N3}$ is a small impedance is also eliminated. With $V_{BL}$ at $V_{DD}/2$, a cell selected for read will either raise the bit line level if storing a "1" or lower the bit line level if storing a "0," but $V_A$ will remain within safe limits. Hence, $Z_{N3}$ can safely be made a smaller impedance during read enabling faster read-out of the memory cell since more current can be sourced or sunk.

The greater freedom in the design of N3 enables the flip-flop transistors to be designed as small as possible. Hence, a smaller cell can be designed enabling the design of higher density memory arrays. Precharging the bit lines enables the much faster sensing of cell states. Sense amplifiers coupled to the bit lines are precharged to their mid point (highest gain and sensitivity) and are able to sense small excursion above or below the precharge point faster. Each row of cells has a word line (W1 . . . W128) connected to the gate (control) electrodes of the gating transistors of that row and each column of cells has a bit line (B1 . . . B128) connected to one end of the conduction paths of the gating transistors of that column. External input memory address line signals 18 are applied to a transition detection circuit 17. The output address lines of circuit 17 are applied to level shift and word line decoder circuit 14 whose outputs determine the rows selected for write or read, and to bit line decoder 24 to determine which bit line gets connected to master bit line 22.

Circuit 20, is connected to MBL 22 which is coupled via bit line decoder circuit 24 to the bit lines (B1 . . . B128) of the array. Bit line decoder 24 responsive to sections 17 and 14 produces signals ($\phi i$ and $\bar{\phi} i$) applied to the transmission gates Ti, where $1 \leq i \leq 128$, for selectively coupling the output of the precharge circuit 20 onto a selected bit line. The precharge circuit 20, as above, functions to establish a predetermined voltage on the bit lines. By way of example, for cells with $V_{FP}$ at $V_{DD}/2$ the precharge circuit sets the bit lines at approximately $V_{DD}/2$. In the operation of the memory array it should be appreciated that the memory cells are comprised of cross coupled complementary symmetry inverters and that the inverter stage of circuit 20 is a like complementary symmetry inverter. This enables the scaling of the relative devices to be more easily marked.

Figure 3:
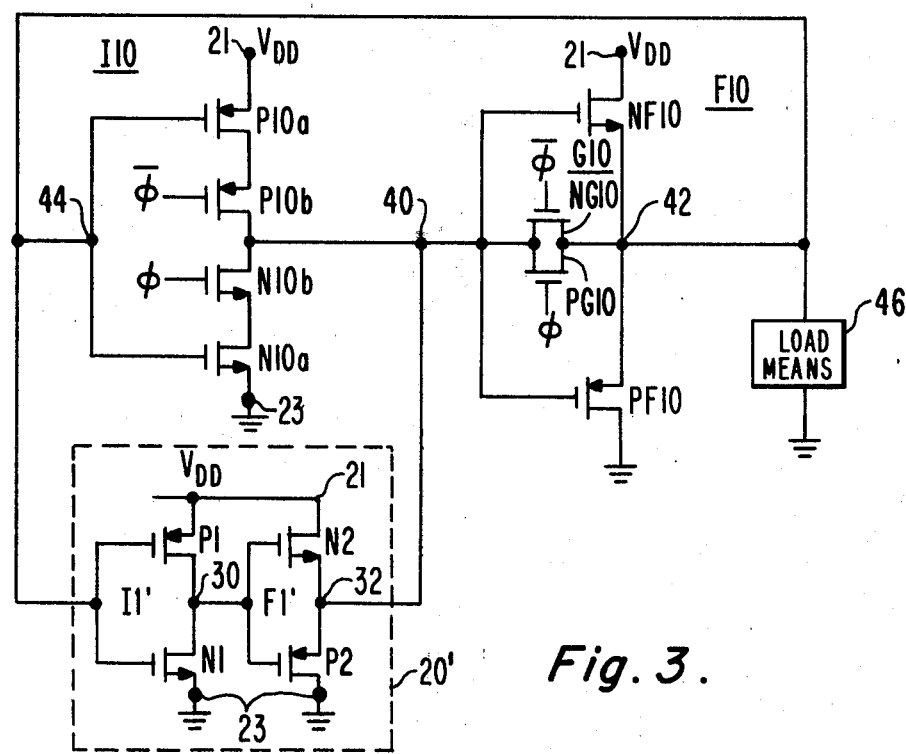
FIG. 3 is a schematic diagram of another circuit embodying the invention.

The circuit of FIG. 3 includes a clocked complementary symmetry inverter I10 connected at its output terminal 40 to the input of a complementary symmetry source follower stage F10. The output terminal 42 of stage F10 is connected to the input 44 of inverter I10 and is connected to a load means such as 46. A complementary transistor transmission gate G10 is connected between the input and the output 44 of stage F10.

Inverter I10 includes IGFETs P10a and P10b having their conduction paths connected in series between $V_{DD}$ terminal 21 and output 40 and IGFETs N10a and N10b having their conduction paths connected in series between output 40 and ground terminal 23. The gates of P10a and N10a are connected to terminal 44. A control signal $\bar{\phi}$ is applied to the gate of P10b and its complement, $\phi$, is applied to the gate of N10b, whereby P1b and N1b are turned-off concurrently or turned-on concurrently. F10, like F1, includes complementary IGFETs (NF10 and PF10) connected to conduct in the source follower mode (also referred to herein as the voltage follower mode since the voltage at the source follows the voltage at the gate plus or minus some voltage offset due to the $V_T$ of the transistors.

G10 is comprised of a P-channel IGFET PG10 and an N-channel IGFET NG10 having their conduction paths connected in parallel between the input and output of F10. The signal $\bar{\phi}$ is applied to the gate of NG10 and the signal $\phi$ is applied to the gate of PG10, whereby NG10 and PG10 are turned on at the same time and turned off at the same time. When NG10 and PG10 are turned on, P10b and N10b are turned-off, and vice-versa when NG10 and PG10 are turned-off P10b and N10b are turned-on.

Connected between the input 44 and the output 40 of inverter I10 is a complementary symmetry inverter I1' driving a circuit 20' comprising complementary symmetry source follower F1'; I1' and F1' being, respectively, similar to I1 and F1 of FIG. 1 need not be detailed.

In this circuit source follower stage F10 is designed to provide very large currents to a load means, such as 46, connected to output 42. Therefore, transistors NF10 and PF10 are designed to have larger geometries than transistors P2 and N2 in F1'. Also, transistors P10a, P10b, N10a and N10b are designed to have larger geometries than transistors P1 and N1.

When the load is to be quickly set to a desired level, transistors P10b and N10b are turned on ($\bar{\phi}$ is low, $\phi$ is high) and gate G10 is turned off. Inverter I10 and source follower F10 then function in a similar manner to that described above for I1 and F1 in FIG. 1 and produce a voltage at output 42 which is a portion of the operating potential applied between power terminals 21 and 23. The drive provided by I10 at output 40 overpowers and nullifies the effect of I1' and F1'. NG10 and PG10 are turned-off and stage F10 can conduct (source or sink) relatively large currents.

When the load is charged to the desired condition or when it is desired to decrease the drive to the load, transmission gate G10 is turned on. The turn-on of NG10 and PG10 causes the potential between the gate and source ($V_{GS}$) of source follower transistors NF10 and PF10 to go to, or close to, zero volts. This turns-off NF10 and PF10.

The significance of turning off the source follower transistors by this means is best appreciated by noting that, normally, the output of a driving stage is coupled via some switch means, such as selectively enabled transmission gate, to a load. However, when large currents have to pass through the switch means connected between the driving stage and the load, an unnecessary voltage drop occurs across the switch means resulting in unwanted power dissipation. In this circuit, the need for a series switch means is eliminated. In FIG. 3, instead of breaking the conduction path between the source follower output and the load, a switch (G10) is placed between the gate and source electrode of the source follower transistors.

When transistors NF10 and PF10 are turned on hard, the transmission gate G10 is off and does not load or affect the passage of large currents. When transistors NF10 and PF10 are to be turned off and the need for large charging and/or discharging currents is no longer present, gate G10 is turned on. The drop across G10 when passing relatively low currents is not significant, and NG10 and PG10 need not be made large geometry devices.

With transistors P10b and N10b turned off, inverter I10 is turned off. The circuit driving the load now includes I1' driving F1' and the output 32 of F1' is fed to the output 42 and is also fed back via gate G10 to the input 44 of I1'. The circuit functions in a similar manner to that described in FIG. 1 above and need not be detailed. The series impedance of G10 is not significant since it only functions to add a relatively low series impedance in series with the extremely high input impedance of I1'.

If the circuit block 20' is designed to dissipate minimum static power the impedances of transistors P2 and N2 will be made relatively large. The stiffness of the resultant $V_{DD}/2$ supply (i.e. the output of F1') will tend to be low in response to sudden application or removal of an external transient load. That is, the output voltage at 32 will swing significantly above and below $V_{DD}/2$. Fast response and increased stiffness can be obtained by using larger output devices (e.g. NF10 and PF10) at the expense of increased power dissipation.

In memories, the application of a load to the $V_{DD}/2$ power supply (line 42) can be anticipated from changes in the addresses 18 shown in FIG. 1 applied to the circuit. Both low standby dissipation and fast response can be obtained by switching between a "minimum dissipation" circuit 20 and a "fast" $V_{DD}/2$ generator (I10, F10) as shown in FIG. 3. Overshoot, undershoot and damping characteristics of the $V_{DD}/2$ supply in response to transient loads are significantly improved by means of using a "stiff" low impedance source follower stage F10 which can be selectively switched out of the circuit in favor of a somewhat higher impedance source follower circuit F1'. In this sense, the switching in response to signal, $\phi$, emulates efficient filter circuitry. Thus, a filter can be formed which is very compact and thus makes efficient use of integrated circuit area.

Thus, in the circuit of FIG. 3, the output impedance of the circuit (at output 42) can be varied by switching the source follower F10 in or out of the circuit. When F10 is out of the circuit, the source follower F1' drives the output and it is its output impedance which controls the drive capability of the circuit. When F10 is in circuit ($\bar{\phi}$ is low, $\phi$ is high) F10 drives the output and it is its output impedance which controls the drive capability of the circuit.

In FIGS. 1 and 3 the drains of the source follower transistors were returned to $V_{DD}$ and ground, i.e. the same potentials applied to the inverter stages. However, it should be understood that the drains of the source follower transistors could be returned to potentials other than those to which the inverters are connected.

In the circuits shown in FIGS. 1 and 3 the output of the source follower stage was returned to the input of the inverter via a short circuit connection. However, it should be understood that in circuits embodying the invention the feedback connection need not be a short circuit.

What is claimed is:

1. A voltage divider comprising:
   a complementary symmetry inverter comprised of a first P-channel insulated-gate field-effect transistor (IGFET) and a first N-channel IGFET, each IGFET having a gate electrode, and source and drain electrodes defining the ends of a conduction path;
   first and second power terminals for the application therebetween of an operating voltage to be divided, the voltage to be applied to said first terminal being positive relative to the voltage to be applied to said second terminal;
   means connecting the source electrode of said first P-IGFET to said first power terminal and means connecting the source electrode of said first N-IGFET to said second power terminal;

a complementary symmetry voltage follower stage comprising first and second output transistors of P and N conductivity type, respectively, each output transistor having an input and an output and a control electrode;

means connecting the drain electrodes of said first and second IGFETs to the control electrodes of said first and second output transistors;

means for applying relatively positive and relatively negative operating potentials to the output electrodes of said first and second output transistors, respectively;

means connecting said input electrodes of said first and second output transistors to an output terminal for producing thereat a voltage which is a portion of the potential applied between said first and second power terminals; and negligible impedance means connecting said output terminal to the gate electrodes of said first and second IGFETs for feeding back the voltage at said output terminal to said gate electrodes of said first and second IGFETs and for biasing said inverter in the linear portion of its transfer characteristic.

2. The combination as claimed in claim 1 wherein said first and second output transistors are insulated gate field effect transistors.

3. The combination as claimed in claim 2 wherein the IGFETs forming said inverter have much smaller geometries, hence higher impedances for equal values of turn-on voltges, than the IGFETs forming said source follower stage.

4. The combination as claimed in claim 1 wherein the ratio of the geometries of said first P IGFET to that of said first N-IGFET determines the portion of the operating potential produced at the drains of said first P and N IGFETs and at said output terminal.

5. The combination as claimed in claim 1 wherein said negligible impedance means connecting said output terminal to the gate electrodes of said first and second IGFETs is the sole signal connection applied to the gate electrodes of said first P and N IGFETs.

6. In combination with a memory array of cells operated at a given potential, each cell being coupled to a bit line, means for precharging the bit lines to a potential which is a fraction of the given potential comprising:

a first complementary symmetry inverter stage having an input and an output and having first and second power terminals across which is applied a voltage of said given potential;

a complementary symmetry voltage follower stage having an input connected to the output of said inverter stage and having an output direct current connected to the input of said inverter stage; and means for selectively applying the output of said follower stage to a bit line.

7. the combination comprising:

a complementary symmetry inverter stage having an input and an output;

a complementary symmetry source follower stage having an input and an output;

means connecting the input of the source follower stage to the output of the inverter, and means connecting the output of the source follower stage to the input of the inverter;

a selectively enabled switch means having a conduction path and a control element said switch means characterized in that its conduction path exhibits a relatively low impedance when said switch means is enabled and exhibits a relatively high impedance when disabled; and means connecting the conduction path of said switch means between the input and the output of said source follower.

8. The combination as claimed in claim 7 wherein said source follower is a first source follower and wherein said means connecting the input of said source follower stage to the output of said inverter stage includes a second source follower stage having its input connected to the output of the inverter and having its output connected to the input of said first source follower stage.

9. The combination as claimed in claim 7 wherein said inverter is a clocked complementary symmetry inverter comprising first and second transistors of one conductivity type and third and fourth transistors of second complementary conductivity type;

wherein the transistors of said one conductivity type have their conduction paths connected between a first power terminal and the inverter output;

wherein the transistors of said second conductivity type have their conduction paths connected between the inverter output and a second power terminal;

wherein the gate electrodes of said first and third transistors are connected to the output of said first source follower stage; and wherein signals are applied to the gate electrodes of said second and fourth transistors of a polarity to turn them both on concurrently or turn them both off concurrently.

10. The combination as claimed in claim 9 wherein said switch means includes a fifth transistor of said one conductivity type and a sixth transistor of said second conductivity type, wherein said fifth and sixth transistors have their conduction paths connected in parallel between said input and said output of said first source follower stage;

wherein signals are applied to the gate electrodes of said fifth and sixth transistors for turning them both on concurrently or for turning them both off concurrently; and wherein the signals turning on said fifth and sixth transistors are of a polarity to turn off said second and fourth transistors and wherein said signals turning off said fifth and sixth transistors have a polarity to turn on said second and fourth transistors.

11. The combination as claimed in claim 7 wherein said complementary symmetry inverter is a first inverter and wherein said complementary symmetry source follower is a first source follower, and further including a second complementary symmetry inverter having a higher output impedance than said first inverter, and a second complementary symmetry source follower having a higher output impedance than said first source follower, and wherein the input of said second inverter is connected to the input of said first inverter, wherein the output of said second inverter is connected to the input of said second source follower; and wherein the output of said second source follower is connected to the input of said first source follower.

12. The combination comprising:

first and second complementary symmetry source follower stages, the output impedance of the second stage being less than that of the first stage;

means coupling the output of the first stage to the input of the second stage;

means coupling the output of the second stage to a load; and selectively enabled switch means connected between the input and output of the second stage for, when enabled, turning off the second stage and driving said load with said first stage.

13. The combination as claimed in claim 12 wherein each one of said complementary source follower stages includes an insulated gate field effect transistor of P-conductivity and another insulated gate field effect transistor of N conductivity type.

14. The combination as claimed in claim 13 further including a complementary inverter connected at its input to the output of said second stage and at its output to the input of said first stage.

* * * * *

UNITED STATES PATENT AND TRADEMARK OFFICE
CERTIFICATE OF CORRECTION

PATENT NO. : 4,354,151

DATED : October 12, 1982

INVENTOR(S) : Andrew G. F. Dingwall

It is certified that error appears in the above-identified patent and that said Letters Patent is hereby corrected as shown below:

Col. 2, line 11 "figures" should be --- FIGURES ---.

Col. 5, line 28 "ofthe" should be --- of the ---.

Col. 6, line 34 "$1 \leq i \leq 128$" should be --- $1 \leq i \leq 128$ ---.

Col. 7, line 9 "N10bare" should be --- N10b are ---.

Col. 9, line 60 "the" should be --- The ---.

Signed and Sealed this

First Day of February 1983

[SEAL]

*Attest:*

*Attesting Officer*

GERALD J. MOSSINGHOFF

*Commissioner of Patents and Trademarks*